(12) United States Patent
Lien et al.

(10) Patent No.: US 11,830,762 B2
(45) Date of Patent: Nov. 28, 2023

(54) METHOD OF MANUFACTURING SEMICONDUCTOR STRUCTURE

(71) Applicant: NANYA TECHNOLOGY CORPORATION, New Taipei (TW)

(72) Inventors: Chen-Hao Lien, Taipei (TW); Cheng-Yan Ji, New Taipei (TW); Chu-Hsiang Hsu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 132 days.

(21) Appl. No.: 17/546,293

(22) Filed: Dec. 9, 2021

(65) Prior Publication Data
US 2023/0187266 A1    Jun. 15, 2023

(51) Int. Cl.
*H01L 21/762* (2006.01)
*H01L 21/225* (2006.01)

(52) U.S. Cl.
CPC .... *H01L 21/76237* (2013.01); *H01L 21/2257* (2013.01); *H01L 21/76229* (2013.01)

(58) Field of Classification Search
CPC ........... H01L 21/76237; H01L 21/2257; H01L 21/76229
See application file for complete search history.

(56) References Cited

U.S. PATENT DOCUMENTS

| 5,837,579 | A | 11/1998 | Huang |
| 6,376,326 | B1 | 4/2002 | Lou |
| 6,436,763 | B1 | 8/2002 | Huang et al. |
| 11,121,135 | B1* | 9/2021 | Ikeda ................ H01L 23/53266 |
| 11,393,908 | B1 | 7/2022 | Suresha et al. |
| 2006/0177976 | A1* | 8/2006 | Lenoble ............ H01J 37/32412 257/E29.054 |
| 2020/0388618 | A1 | 12/2020 | Ikeda |
| 2021/0272961 | A1 | 9/2021 | Tung et al. |
| 2022/0037199 | A1* | 2/2022 | Cheng ................ H01L 27/1203 |

OTHER PUBLICATIONS

Brigham Young University, Diffused Ion Implantation Profile Calculator and Graph, https://cleanroom.byu.edu/implantcal.*
S. Shimomura et al., "Process Control Technique to Dramatically Reduce Voids in Phosphorus-Doped Poly-Silicon for Trench Field-Plate MOSFETs," 2019 Joint International Symposium on e-Manufacturing & Design Collaboration(eMDC) & Semiconductor Manufacturing (ISSM), Hsinchu, Taiwan, 2019, pp. 1-4, doi: 10.*
Office Action dated Feb. 23, 2023 related to U.S. Appl. No. 17/546,537.
Office Action dated Jun. 27, 2023 related to U.S. Appl. No. 17/546,537.

* cited by examiner

*Primary Examiner* — Yara B Green
*Assistant Examiner* — Fakeha Sehar
(74) *Attorney, Agent, or Firm* — Xuan Zhang

(57) ABSTRACT

The present disclosure provides a method of manufacturing a semiconductor structure having an electrical contact. The method includes providing a semiconductor substrate; forming a dielectric structure over the semiconductor substrate, the dielectric structure having a trench; filling a polysilicon material in the trench of the dielectric structure; detecting the polysilicon material to determine a region of the polysilicon material having one or more defects formed therein; implanting the polysilicon material with a dopant material into the region; and annealing the polysilicon material to form a doped polysilicon contact.

8 Claims, 15 Drawing Sheets

METHOD OF MANUFACTURING SEMICONDUCTOR STRUCTURE

TECHNICAL FIELD

The present disclosure relates to a method of manufacturing a semiconductor structure, and more particularly, to a method of manufacturing a semiconductor structure having an electrical contact.

DISCUSSION OF THE BACKGROUND

Semiconductor structures are used in a variety of electronic applications, and the dimensions of semiconductor structures are continuously being scaled down to meet the current application requirements. However, a variety of issues arise during the scaling-down process and impact the final electrical characteristics, quality, and yield. For example, defects formed within electrical contact structures of semiconductor structures may result in an increase in resistance and/or current leakage. Therefore, challenges remain in improving product quality, yield, and reliability.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor structure including a semiconductor substrate and a doped polysilicon contact. The doped polysilicon contact is disposed over the semiconductor substrate. The doped polysilicon contact includes a dopant material having a dopant concentration equaling or exceeding about $10^{15}$ atom/cm$^3$.

Another aspect of the present disclosure provides a semiconductor structure including a semiconductor substrate and an electrical contact. The electrical contact is electrically connected to the semiconductor substrate. The electrical contact includes a conductive element and a dopant material having a dopant concentration equaling or exceeding about $10^{15}$ atom/cm$^3$. The dopant material includes a first dopant element, and a difference between an atomic weight of the conductive element and an atomic weight of the first dopant element is less than about 100.

Another aspect of the present disclosure provides a method of manufacturing a semiconductor structure. The method includes providing a semiconductor substrate and forming a dielectric structure over the semiconductor substrate, the dielectric structure having a trench. The method also includes filling a polysilicon material in the trench of the dielectric structure and detecting the polysilicon material to determine a region of the polysilicon material having one or more defects formed therein. The method further includes implanting the polysilicon material with a dopant material into the region and annealing the polysilicon material to form a doped polysilicon contact.

By implanting a dopant material into a region of a conductive material having one or more defects formed in a trench, the atoms and/or ions of the dopant material may repair the defects of the conductive material. Therefore, the resistance of an electrical contact formed from the repaired conductive material can be reduced, the data rate can be improved, and current leakage can be further prevented.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1A:
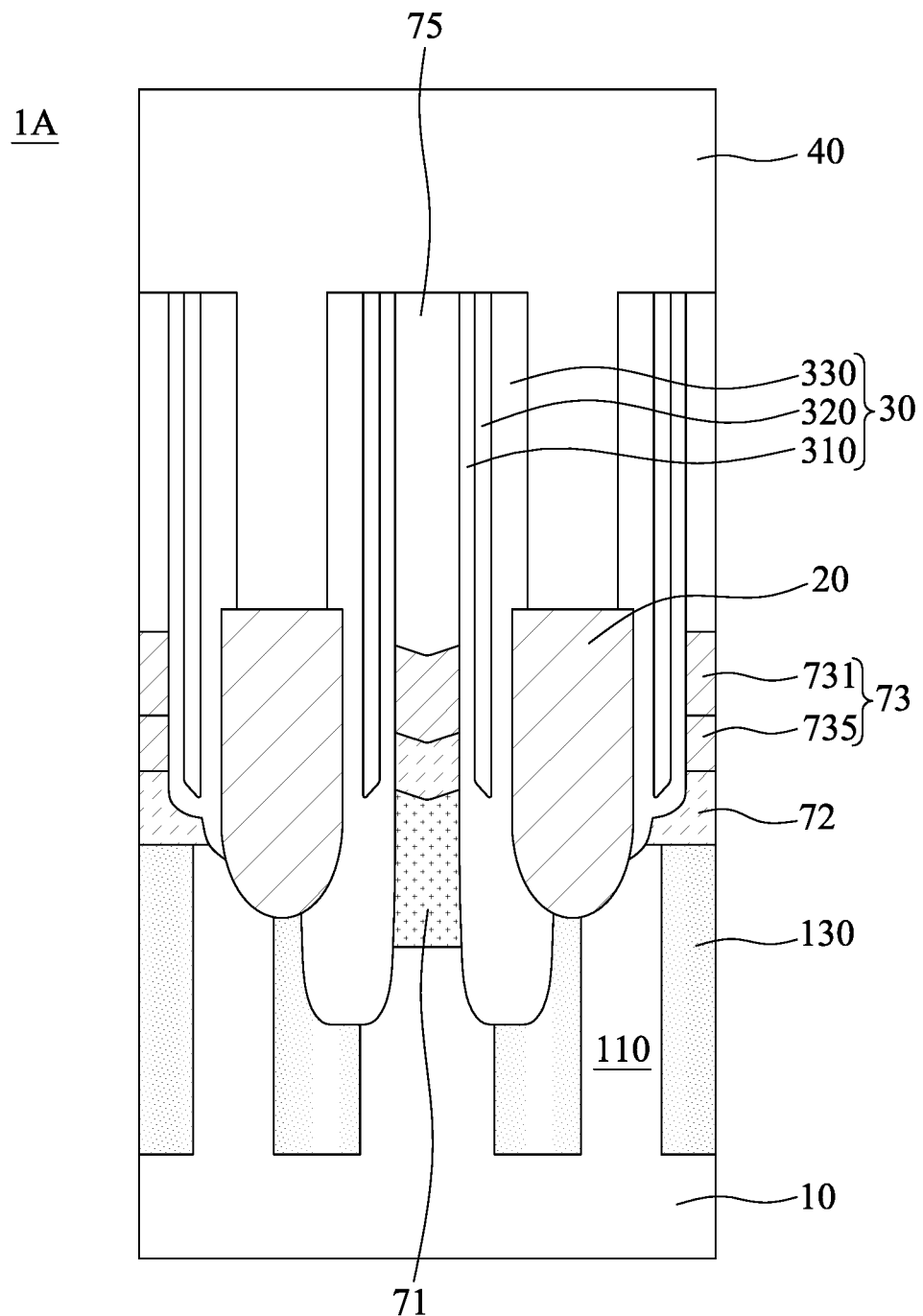
FIG. 1A is a schematic view of a semiconductor structure, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1A is a schematic view of a semiconductor structure 1A, in accordance with some embodiments of the present disclosure. The semiconductor structure 1A includes a semiconductor substrate 10, one or more electrical contacts 20, a dielectric structure 30, an electronic component 40, a contact structure 71, a buffer layer 72, a conductive structure 73, and a hardmask structure 75.

The semiconductor substrate 10 may include one or more active regions 110 and an isolation structure 130 adjacent to the active regions 110. In some embodiments, the active regions 110 of the semiconductor substrate 10 may be defined by the isolation structure 130. The semiconductor substrate 10 may be formed of or include, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other IV-IV, III-V or I-VI semiconductor material. The isolation structure 130 may be formed of or include an insulating material such as silicon oxide, silicon nitride, silicon oxynitride, or a combination thereof.

The electrical contact 20 may be disposed over the semiconductor substrate 10. In some embodiments, the electrical contact 20 is electrically connected to the semiconductor substrate 10. In some embodiments, the electrical contact 20 directly contacts the active region 110 of the semiconductor substrate 10. In some embodiments, an aspect ratio of the electrical contact 20 equals or exceeds about 2. In some embodiments, an aspect ratio of the electrical contact 20 equals or exceeds about 3. In some embodiments, an aspect ratio of the electrical contact 20 equals or exceeds about 5. In some embodiments, an aspect ratio of the electrical contact 20 equals or exceeds about 8. In some embodiments, the semiconductor structure 1A includes a plurality of electrical contacts 20.

In some embodiments, the electrical contact 20 may be formed of or include one or more conductive elements 200. In some embodiments, the conductive element 200 may be silicon or a metal. The metal may include, for example, aluminum, copper, tungsten, or cobalt. In some embodiments, the electrical contact 20 may be formed of or include doped polysilicon. In some embodiments, the electrical contact 20 may be formed of or include aluminum, copper, tungsten, cobalt, or an alloy thereof. In some embodiments, the electrical contact 20 may be formed of or include metal nitride or metal silicide.

The electrical contact 20 may further include a dopant material. In some embodiments, the dopant material has a dopant concentration equaling or exceeding about $10^{15}$ atom/cm$^3$. In some embodiments, the dopant concentration of the dopant material is from about $10^{15}$ atom/cm$^3$ to about $10^{19}$ atom/cm$^3$. In some embodiments, the dopant concentration of the dopant material is from about $10^{15}$ atom/cm$^3$ to about $10^{18}$ atom/cm$^3$. In some embodiments, the dopant concentration of the dopant material is from about $10^{15}$ atom/cm$^3$ to about $10^{17}$ atom/cm$^3$.

In some embodiments, a difference between an atomic weight of the conductive element 200 and an atomic weight of a dopant element (also referred to as "a first dopant element") of the dopant material is less than about 100. In some embodiments, a difference between an atomic weight of the conductive element 200 and an atomic weight of a dopant element (or the first dopant element) of the dopant material is less than about 50. In some embodiments, the dopant material comprises a dopant element having an atomic weight from about 28 to about 130. In some embodiments, the dopant material comprises a dopant element having an atomic weight from about 28 to about 75.

In some embodiments, the dopant material of the electrical contact 20 may further include at least one additional dopant element (also referred to as "a second dopant element") different from the aforesaid dopant element (or the first dopant element). In some embodiments, a difference between the atomic weight of the conductive element 200 and an atomic weight of the additional dopant element (or the second dopant element) is less than about 100. In some embodiments, a difference between the atomic weight of the conductive element 200 and an atomic weight of the additional dopant element (or the second dopant element) is less than about 50. In some embodiments, the additional dopant element (or the second dopant element) has an atomic weight from about 28 to about 130. In some embodiments, the additional dopant element (or the second dopant element) has an atomic weight from about 28 to about 75.

In some embodiments, the one or more dopant elements of the dopant material may be neutral dopants. In some embodiments, the dopant elements may have the same polarity. In some embodiments, the electrical contact 20 may include one or more conductive elements 200 and one or more neutral dopant elements. In some embodiments, the electrical contact 20 may include one or more conductive elements and one or more p-typed dopant elements. In some embodiments, the electrical contact 20 may include one or more conductive elements 200 and one or more n-typed dopant elements.

In some embodiments, the electrical contact 20 includes doped polysilicon, and the one or more dopant elements of the dopant material may be neutral dopants. In some embodiments, the electrical contact 20 includes doped polysilicon, and the one or more dopant elements of the dopant material may include dopants that have a doping type or polarity the same as the doping type or polarity of the doped polysilicon. With the aforementioned design, undesired influence from the dopant material to the electrical contact 20 can be reduced or prevented, and thus the electrical performance of the semiconductor structure 1A can be protected from adverse effects of the dopant material.

In some embodiments, the dopant material of the electrical contact 20 includes silicon (Si), germanium (Ge), phosphine (P), arsenic (As), antimony (Sb), or any combination thereof. In some embodiments, each of the dopant elements of the dopant material may be Si, Ge, P, As, or Sb.

In some embodiments, the electrical contact 20 includes doped polysilicon, and the dopant elements of the dopant material may include one or more neutral dopants. In some embodiments, the electrical contact 20 includes doped polysilicon, and the dopant elements of the dopant material may include Ge, P, As, or any combination thereof.

The dielectric structure 30 may be disposed over the semiconductor substrate 10. In some embodiments, the dielectric structure 30 has a trench 30T, and the electrical contact 20 is filled in the trench 30T of the dielectric structure 30. In some embodiments, the electrical contact 20 penetrates the trench 30T of the dielectric structure 30. In some embodiments, the electrical contact 20 contacts the active region 110 of the semiconductor substrate 10. In some embodiments, the electrical contact 20 contacts the isolation structure 130 of the semiconductor substrate 10. In some embodiments, the dielectric structure 30 includes dielectric layers 310, 320 and 330.

In some embodiments, the dielectric layer 310 is formed on sidewalls of the trench 30T. In some embodiments, a protruding portion of the dielectric layer 310 extends into the isolation structure 130. The dielectric layer 310 may be formed of or include a dielectric material such as silicon oxide, silicon nitride, silicon oxynitride, or a combination thereof. In some embodiments, the dielectric layer 310 includes silicon nitride.

In some embodiments, the dielectric layer 320 is between the dielectric layer 310 and the dielectric layer 330. In some embodiments, the dielectric layer 320 contacts the dielectric layer 310 and the dielectric layer 330. The dielectric layer 320 may be formed of or include a dielectric material such as silicon oxide, silicon nitride, silicon oxynitride, or a combination thereof. In some embodiments, the dielectric layer 320 includes silicon oxide.

In some embodiments, the dielectric layer 330 is disposed between the electrical contact 20 and the dielectric layer 320. In some embodiments, the dielectric layer 330 is in contact with the electrical contact 20. In some embodiments, the dielectric layer 330 is in contact with the dielectric layer 310. In some embodiments, a portion of the dielectric layer 330 contacts the active region 110 of the semiconductor substrate 10. The dielectric layer 330 may be formed of or include a dielectric material such as silicon oxide, silicon nitride, silicon oxynitride, or a combination thereof. In some embodiments, the dielectric layer 330 includes silicon nitride.

In some embodiments, the semiconductor structure 1A includes a plurality of dielectric structures 30. In some embodiments, each of the electrical contacts 20 is filled in the trench 30T of each of the dielectric structures 30. In some embodiments, the protruding portions of the dielectric layer 310 of adjacent dielectric structures 30 are adjacent to each other.

The electronic component 40 may be disposed over the electrical contact 20. In some embodiments, the electronic component 40 is electrically connected to the electrical contact 20. In some embodiments, the electronic component 40 includes a capacitor.

The contact structure 71 may be disposed on the semiconductor substrate 10. In some embodiments, the contact structure 71 may be electrically connected to some of the doped regions (not shown in drawings) of the semiconductor substrate 10. In some embodiments, the contact structure 71 is disposed between adjacent dielectric structures 30. In some embodiments, the contact structure 71 is disposed between two adjacent protruding portions of the dielectric layers 310. The contact structure 71 may include a conductive material, for example, doped polysilicon, a metal, or a metal silicide. The metal may be, for example, aluminum, copper, tungsten, cobalt, or an alloy thereof. The metal silicide may be, for example, nickel silicide, platinum silicide, titanium silicide, molybdenum silicide, cobalt silicide, tantalum silicide, tungsten silicide, or the like. In some embodiments, the contact structure 71 includes doped polysilicon. In some embodiments, the contact structure 71 may serve as a bit line contact.

The buffer layer 72 may be disposed on the semiconductor substrate 10. The buffer layer 72 may be formed as a stacked layer or a single layer including silicon oxide, silicon nitride, silicon oxynitride, silicon nitride oxide, fluoride-doped silicate, or the like. In some embodiments, the buffer layer 72 includes silicon nitride.

The conductive structure 73 may be disposed on the semiconductor substrate 10. In some embodiments, one or more portions of the conductive structure 73 are disposed on the contact structure 71. In some embodiments, portions of the conductive structure 73 are disposed on the buffer layer 72.

In some embodiments, the conductive structure 73 includes conductive layers 731 and 735. In some embodiments, one or more portions of the conductive layer 735 are disposed on the contact structure 71. In some embodiments, portions of the conductive layer 735 are disposed on the buffer layer 72. In some embodiments, the conductive layer 731 is disposed on the conductive layer 735. The conductive layer 735 may be formed of, for example, polysilicon or titanium nitride. The conductive layer 731 may be formed of, for example, copper, nickel, cobalt, aluminum, or tungsten. In some embodiments, the conductive structure 73 (e.g., the conductive layers 731 and 735) include bit line layers.

The hardmask structure 75 may be disposed on the conductive structure 73. In some embodiments, each portion of the hardmask structure 75 is disposed between adjacent dielectric structures 30.

Figure 1B:
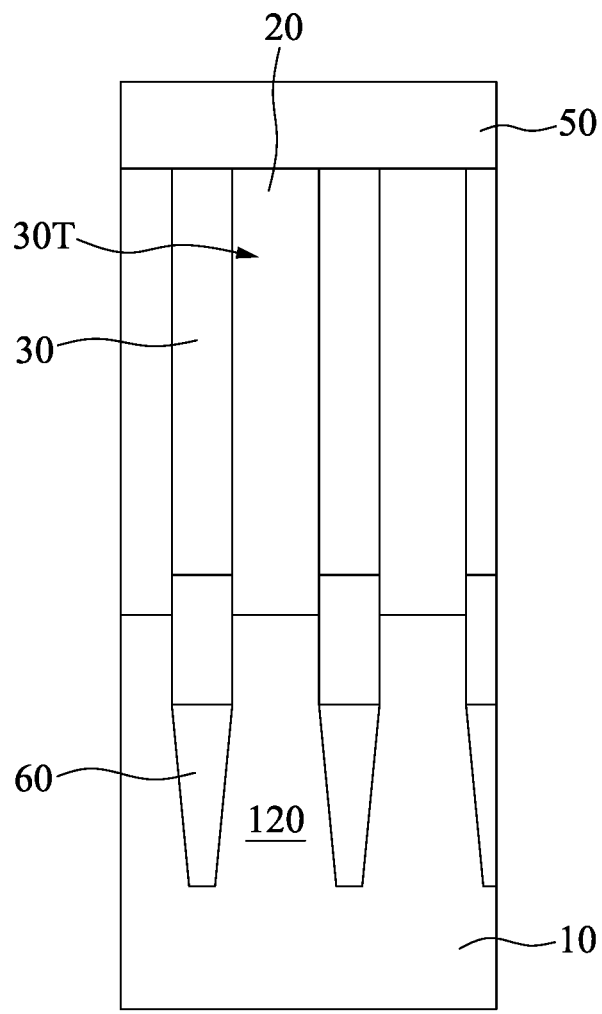
FIG. 1B is a schematic view of a semiconductor structure, in accordance with some embodiments of the present disclosure.

FIG. 1B is a schematic view of a semiconductor structure 1B, in accordance with some embodiments of the present disclosure. The semiconductor structure 1B includes a semiconductor substrate 10, an electrical contact 20, a dielectric structure 30, an electronic component 50, and a conductive feature 60.

The semiconductor substrate 10 may include a plurality of doped regions 120. In some embodiments, the doped regions 120 may be formed by an implantation process using dopant such as phosphorus, arsenic, or antimony. The doped regions 120 may respectively have a dopant concentration ranging from about $10^{17}$ atom/cm$^3$ to about $10^{19}$ atom/cm$^3$. The semiconductor substrate 10 may be formed of or include, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other IV-IV, III-V or I-VI semiconductor material.

The electrical contact 20 may further include a dopant material. In some embodiments, the dopant material has a dopant concentration equaling or exceeding about $10^{15}$ atom/cm$^3$. In some embodiments, the dopant concentration of the dopant material is from about $10^{15}$ atom/cm$^3$ to about $10^{19}$ atom/cm$^3$. In some embodiments, the dopant concentration of the dopant material is from about $10^{15}$ atom/cm$^3$ to about $10^{18}$ atom/cm$^3$. In some embodiments, the dopant concentration of the dopant material is from about $10^{15}$ atom/cm$^3$ to about $10^{17}$ atom/cm$^3$.

In some embodiments, a difference between an atomic weight of the conductive element 200 and an atomic weight of a dopant element (also referred to as "a first dopant element") of the dopant material is less than about 100. In some embodiments, a difference between an atomic weight of the conductive element 200 and an atomic weight of a dopant element (or the first dopant element) of the dopant material is less than about 50. In some embodiments, the dopant material comprises a dopant element having an atomic weight from about 28 to about 130. In some embodiments, the dopant material comprises a dopant element having an atomic weight from about 28 to about 75.

In some embodiments, the dopant material of the electrical contact 20 may further include at least one additional dopant element (also referred to as "a second dopant element") different from the aforesaid dopant element (or the first dopant element). In some embodiments, a difference between the atomic weight of the conductive element 200 and an atomic weight of the additional dopant element (or the second dopant element) is less than about 100. In some embodiments, a difference between the atomic weight of the conductive element 200 and an atomic weight of the additional dopant element (or the second dopant element) is less than about 50. In some embodiments, the additional dopant element (or the second dopant element) has an atomic weight from about 28 to about 130. In some embodiments, the additional dopant element (or the second dopant element) has an atomic weight from about 28 to about 75.

In some embodiments, the one or more dopant elements of the dopant material may be neutral dopants. In some embodiments, the dopant elements may have the same polarity. In some embodiments, the electrical contact 20 may include one or more conductive elements 200 and one or more neutral dopant elements. In some embodiments, the electrical contact 20 may include one or more conductive elements 200 and one or more p-typed dopant elements. In some embodiments, the electrical contact 20 may include one or more conductive elements and one or more n-typed dopant elements.

In some embodiments, the dopant material of the electrical contact 20 includes silicon (Si), germanium (Ge), phosphine (P), arsenic (As), antimony (Sb), or any combination thereof. In some embodiments, each of the dopant elements of the dopant material may be Si, Ge, P, As, or Sb.

In some embodiments, the electrical contact 20 includes doped polysilicon, and the dopant elements of the dopant material may include one or more neutral dopants. In some embodiments, the electrical contact 20 includes doped polysilicon, and the dopant elements of the dopant material may include Ge, P, As, or any combination thereof.

The dielectric structure 30 may be disposed over the semiconductor substrate 10. In some embodiments, the dielectric structure 30 has a trench 30T, and the electrical contact 20 is filled in the trench 30T of the dielectric structure 30. In some embodiments, the electrical contact 20 contacts the doped region 120 of the semiconductor substrate 10. In some embodiments, the electrical contact 20 is electrically connected to the doped region 120 of the semiconductor substrate 10. The dielectric structure 30 may be formed of or include a dielectric material such as silicon oxide, silicon nitride, silicon oxynitride, or a combination thereof. In some embodiments, the dielectric structure 30 includes silicon nitride.

The electronic component 50 may be disposed over the electrical contact 20. In some embodiments, the electronic component 50 is electrically connected to the electrical contact 20. In some embodiments, the electronic component 50 includes a capacitor.

The conductive feature 60 may be disposed in the substrate 10. In some embodiments, the conductive feature 60 is adjacent to the doped region 120 of the substrate 10. In some embodiments, the conductive feature 60 may be an embedded word line.

FIG. 2A to FIG. 2F illustrate various stages of a method of manufacturing a semiconductor structure 1C, in accordance with some embodiments of the present disclosure.

Figure 2A:
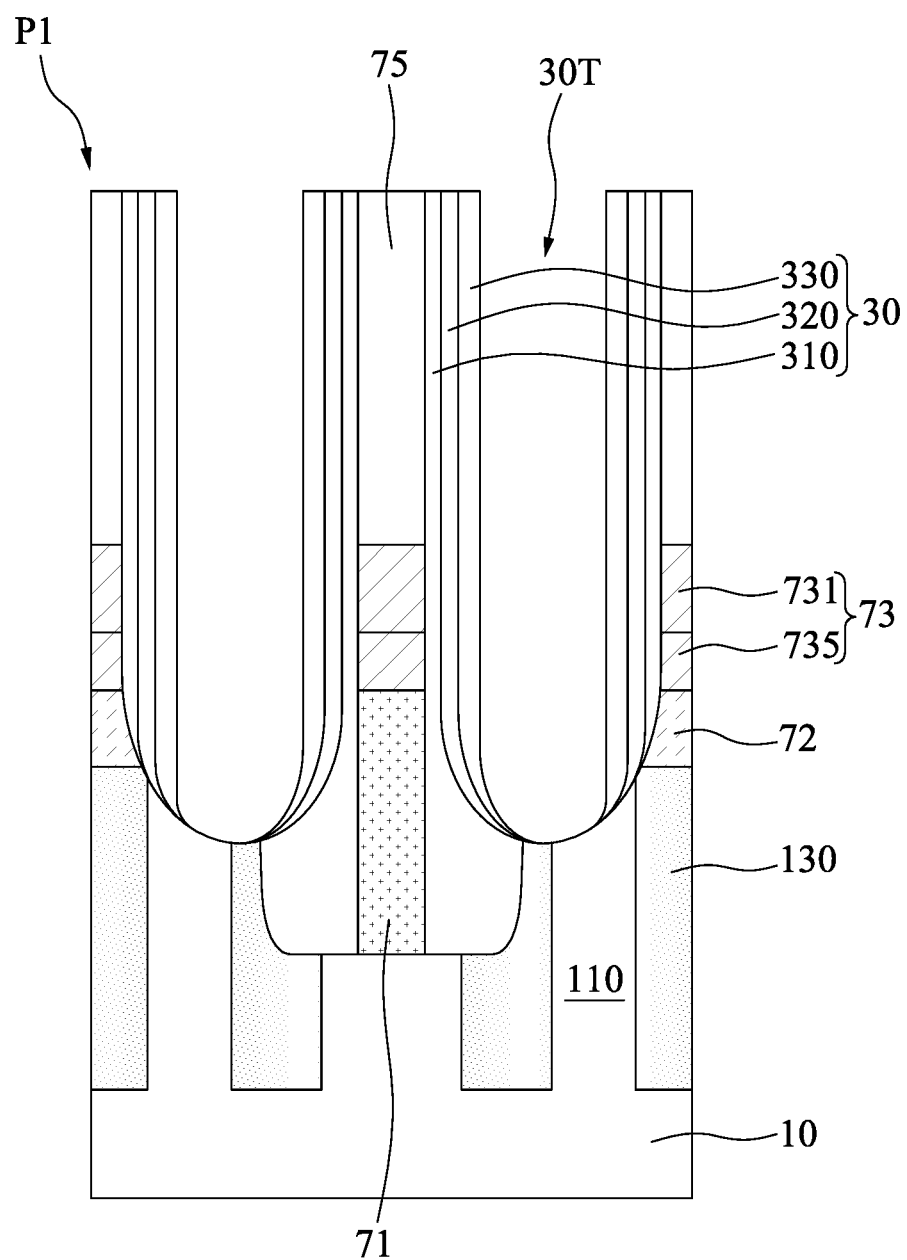
FIG. 2A illustrates one stage of a method of manufacturing a semiconductor structure, in accordance with some embodiments of the present disclosure.

FIG. 2A illustrates one stage of a method of manufacturing a semiconductor structure 1C, in accordance with some embodiments of the present disclosure. A substrate 10 may be provided. The semiconductor substrate 10 may be formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other IV-IV, III-V or I-VI semiconductor material.

Still referring to FIG. 2A, an isolation structure 130 may be formed in the semiconductor substrate 10, and a plurality of active regions 110 of the semiconductor substrate 10 may be defined by the isolation structure 130. Photolithography may be performed to pattern the semiconductor substrate 10 to define positions of the plurality of active regions. Etching may be performed after the photolithography process to form a plurality of trenches in the semiconductor substrate 10. After etching, an insulating material such as silicon oxide, silicon nitride, silicon oxynitride, silicon nitride oxide, or fluoride-doped silicate, may be used to fill the plurality of trenches by deposition. Planarization, such as chemical mechanical polishing, may be performed after the deposition process to remove excess material and provide a substantially flat surface for subsequent processing steps and conformally form the isolation structure 130 and the plurality of active regions 110.

Still referring to FIG. 2A, a buffer layer 72 may be formed on the semiconductor substrate 10. The buffer layer 72 may be formed as a stacked layer or a single layer including silicon oxide, silicon nitride, silicon oxynitride, silicon nitride oxide, fluoride-doped silicate, or the like.

Still referring to FIG. 2A, one or more contact structures 71 may be formed in the buffer layer 72 and contacting the semiconductor substrate 10. One or more openings may be formed in the buffer layer 72 and extending into a portion of the semiconductor substrate 10. Photolithography may be performed to pattern the buffer layer 72 and a portion of the semiconductor substrate 10 to define the position of the opening. Etching may be performed after the photolithography process to form the opening in the buffer layer 72 and extending into the portion of the semiconductor substrate 10. The contact structure 71 may be correspondingly formed in the opening. In some embodiments, a conductive material, for example, doped polysilicon, a metal, or a metal silicide may be deposited into the opening by metallization. After metallization, planarization, such as chemical mechanical polishing, may be performed to remove excess material, provide a substantially flat surface for subsequent processing steps, and form the contact structure 71. The metal may be, for example, aluminum, copper, tungsten, cobalt, or an alloy thereof. The metal silicide may be, for example, nickel silicide, platinum silicide, titanium silicide, molybdenum silicide, cobalt silicide, tantalum silicide, tungsten silicide, or the like. In some embodiments, the contact structure 71 includes doped polysilicon. In some embodiments, the contact structure 71 may serve as a bit line contact.

Still referring to FIG. 2A, a conductive structure 73 may be formed on the semiconductor substrate 10. In some embodiments, a series of deposition processes may be performed to sequentially deposit a conductive layer 735 and a conductive layer 731 on the buffer layer 72 and the contact structure 71. The conductive layer 735 may be formed on the buffer layer 72 and the contact structure 71. The conductive layer 731 may be formed on the conductive layer 735. The conductive layer 735 may be formed of, for example, polysilicon or titanium nitride. The conductive layer 731 may be formed of, for example, copper, nickel, cobalt, aluminum, or tungsten. In some embodiments, the conductive structure 73 (e.g., the conductive layers 731 and 735) include bit line layers.

Still referring to FIG. 2A, an initial hardmask structure may be disposed on the conductive structure 73. A patterned photoresist layer may be formed over the initial hardmask structure and transferring a pattern to the hardmask structure 75. In some embodiments, the initial hardmask structure is etched to form the hardmask structure 75 having the pattern P1. In some embodiments, the initial hardmask structure is etched by plasma etching. In some embodiments, one or more etching operations may be further performed to remove portions of the active regions 110 and portions of the isolation structure 30 of the semiconductor substrate 10, portions of the contact structure 71, and portions of the conductive structure 73 to form one or more trenches defined by the hardmask structure 75.

Still referring to FIG. 2A, a dielectric structure 30 may be formed over the semiconductor substrate 10. In some embodiments, a series of deposition processes may be performed to sequentially deposit dielectric layers 310, 320 and 330 on the semiconductor substrate 10 and the inner walls of the trenches defined by the hardmask structure 75. In some embodiments, the dielectric layers 310, 320 and 330 are formed on the inner walls of the trenches defined by the hardmask structure to form the dielectric structure 30 having a trench 30T.

Figure 2B:
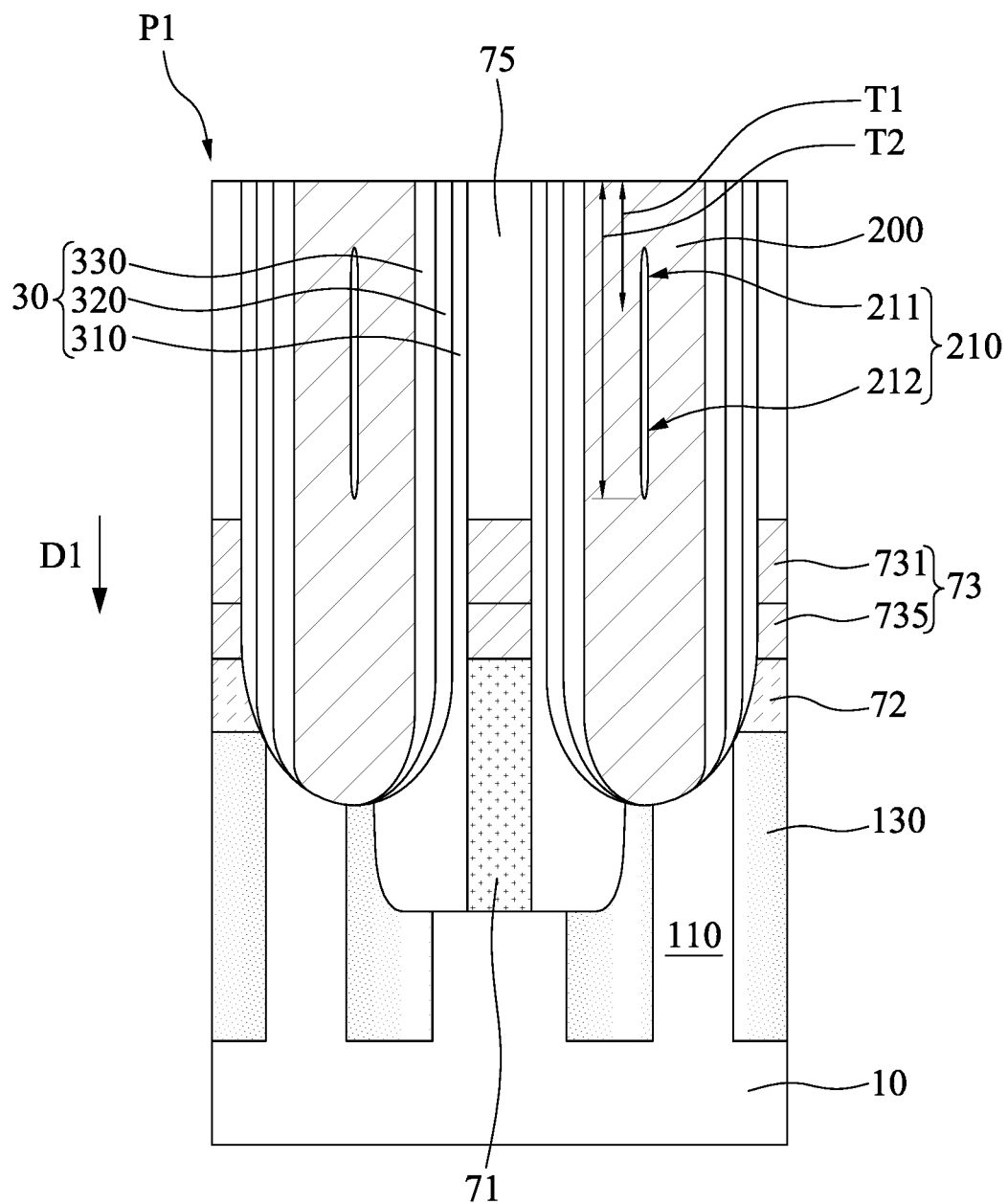
FIG. 2B illustrates one stage of a method of manufacturing a semiconductor structure, in accordance with some embodiments of the present disclosure.

FIG. 2B illustrates one stage of a method of manufacturing a semiconductor structure 1C, in accordance with some embodiments of the present disclosure. A conductive material may be filled in the trench 30T of the dielectric structure 30.

In some embodiments, one or more defects may be formed in a region 210 of the conductive material in the trench 30T.

In some embodiments, a detection device may be used to identify defects. In some embodiments, a detection device may be used to determine the region 210 of the conductive material having one or more defects formed therein. In some embodiments, the defects may include lattice defects, seams, voids, or the like. In some embodiments, the following properties of the region 210 may be detected: a location (e.g., a depth and/or a width) of the region 210, an area of the region 210, and/or a shape of the region 210. The detection device may include a scanning electron microscope (SEM), but the present disclosure is not limited thereto.

In some embodiments, the conductive material may be polysilicon or doped polysilicon. The seams and/or voids in the region 210 of the polysilicon or doped polysilicon material may be formed from lattice defects.

Figure 2C:
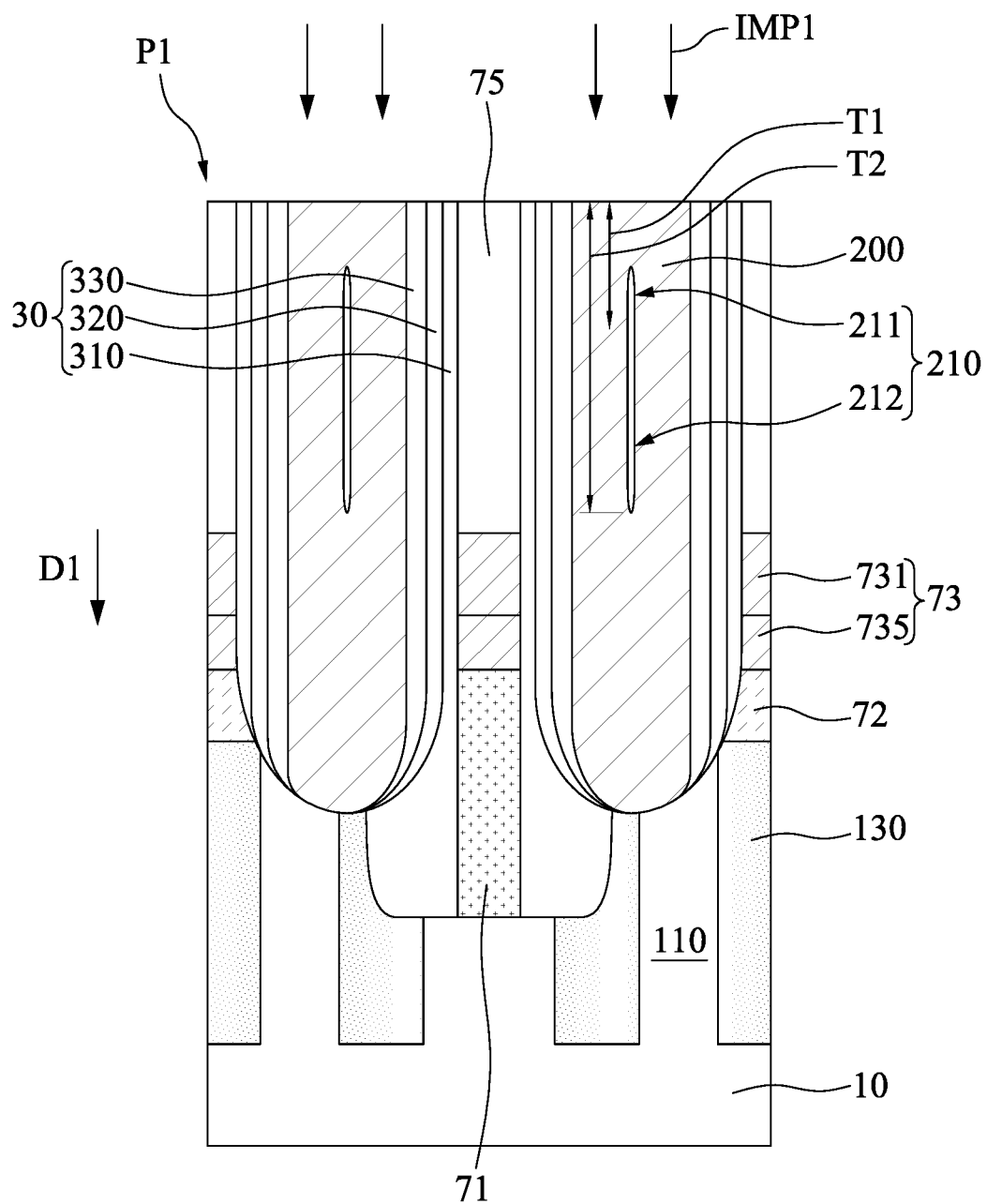
FIG. 2C illustrates one stage of a method of manufacturing a semiconductor structure, in accordance with some embodiments of the present disclosure.

Referring to FIG. 2C, which illustrates one stage of a method of manufacturing a semiconductor structure 1C, in accordance with some embodiments of the present disclosure, conductive material in the trench 30T may be implanted.

In some embodiments, a dopant material is implanted into the region 210 of the conductive material. In some embodiments, one or more processing parameters used for implanting the conductive material are determined according to the detected results of the region 210 of the conductive material. In some embodiments, the one or more processing parameters include a dopant concentration (or an implant dosage concentration), an implant dosage energy, an implantation temperature, and an implantation incidence angle. In some embodiments, one or more processing parameters used for implanting the conductive material are determined according to the location (e.g., the depth and/or the width), the area, and/or the shape of the region 210 of the conductive material.

In some embodiments, the dopant material has a dopant concentration equaling or exceeding about $10^{15}$ atom/cm$^3$. In some embodiments, the dopant concentration of the dopant material is from about $10^{15}$ atom/cm$^3$ to about $10^{19}$ atom/cm$^3$. In some embodiments, the dopant concentration of the dopant material is from about $10^{15}$ atom/cm$^3$ to about $10^{18}$ atom/cm$^3$. In some embodiments, the dopant concentration of the dopant material is from about $10^{15}$ atom/cm$^3$ to about $10^{17}$ atom/cm$^3$.

In some embodiments, the implant dosage energy is from about 10 keV to about 50 keV. In some embodiments, the implant dosage energy is from about 20 keV to about 45 keV. In some embodiments, the implant dosage energy is from about 30 keV to about 40 keV. A relatively small implant dosage energy may provide a less penetration depth of the dopants. A relatively high implant dosage energy may provide a deeper penetration depth of the dopants.

In some embodiments, the implantation temperature is from about 400° C. to about 700° C. In some embodiments, the implantation temperature is from about 450° C. to about 650° C. In some embodiments, the implantation temperature is from about 500° C. to about 600° C.

In some embodiments, the implantation incidence angle is from about 45° to about 90°. In some embodiments, the implantation incidence angle is from about 50° to about 85°. In some embodiments, the implantation incidence angle is from about 60° to about 80°. The penetrating depth of the dopant material may be adjusted by varying the implantation incidence angle. A relatively small implantation incidence angle may provide a less penetration depth of the dopant material.

In some embodiments, the conductive material includes a conductive element 200, the dopant material includes a dopant element, and a difference between an atomic weight of the conductive element 200 and an atomic weight of a dopant element of the dopant material is less than about 100. In some embodiments, the difference between the atomic weight of the conductive element 200 and the atomic weight of the dopant element of the dopant material is less than about 50. In some embodiments, the dopant material includes Si, Ge, P, As, Sb, or any combination thereof.

In some embodiments, the conductive material includes polysilicon, and the dopant material includes one or more dopant elements having an atomic weight from about 28 to about 130. In some embodiments, the dopant material includes Si, Ge, P, As, Sb, or any combination thereof.

In some embodiments, the region 210 of the conductive material having one or more defects formed therein may include a plurality of different locations (e.g., locations 211 and 212). In some embodiments, the various locations of the region 210 have different depths. For example, a depth T1 of the location 211 may be different from a depth T2 of the location 212. In some embodiments, each of the locations may extend vertically along the depth direction D1 of the trench 30T, and the depth of each of the locations of the region 210 refers to the depth (or extending distance) starting from an uppermost surface of the conductive material to the bottom most position of the location.

In some embodiments, a dopant element (also referred to as "a first dopant element") is implanted into the location 211 of the region 210 of the conductive material by an implantation operation IMP1.

Figure 2D:
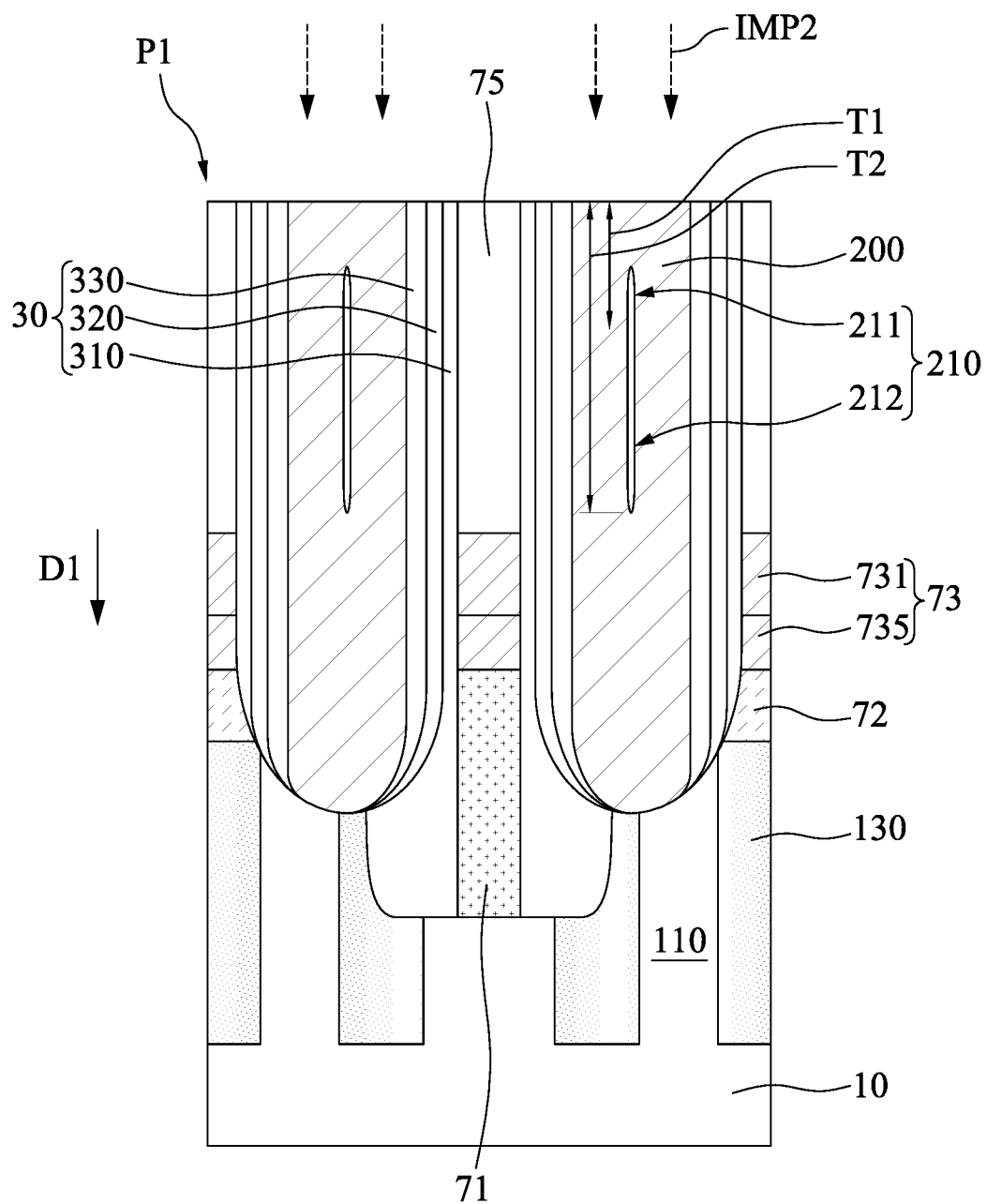
FIG. 2D illustrates one stage of a method of manufacturing a semiconductor structure, in accordance with some embodiments of the present disclosure.

FIG. 2D illustrates one stage of a method of manufacturing a semiconductor structure 1C, in accordance with some embodiments of the present disclosure. The conductive material in the trench 30T may be further implanted.

In some embodiments, another dopant element (also referred to as "a second dopant element") is implanted into the location 212 of the region 210 of the conductive material by an implantation operation IMP2. In some embodiments, the dopant element (or the first dopant element) used in the implantation operation IMP1 is different from the dopant element (or the first dopant element) used in the implantation operation IMP2. For example, the atomic weight of the dopant element (or the first dopant element) used in the implantation operation IMP1 may be different from the atomic weight of the dopant element (or the first dopant element) used in the implantation operation IMP2.

In some embodiments, the depth T1 of the location 211 is less than the depth T2 of the location 211. In some embodiments, the atomic weight of the dopant element used in the implantation operation IMP1 exceeds the atomic weight of the dopant element used in the implantation operation IMP2. In some embodiments, the implantation incidence angle of the implantation operation IMP1 is smaller than the implantation incidence angle of the implantation operation IMP2.

In some embodiments, the dopant elements for the implantation operations IMP1 and IMP2 may differ, and the dopant elements for the implantation operations IMP1 and IMP2 each may include Si, Ge, P, As, or Sb. In some embodiments, the dopant elements for the implantation operations IMP1 and IMP2 may be the same, and one or more processing parameters used in the implantation operation IMP1 and used in the implantation operation IMP2 may be different. For example, the dopant concentrations (or the implant dosage concentrations), the implant dosage energies, the implantation temperatures, and/or the implantation incidence angles used in the implantation operations IMP1 and IMP2 may be different according to the detected results of the region 210 of the conductive material, for example, the depths T1 and T2.

In some embodiments, the conductive material in the trench 30T may be implanted multiple times. In some embodiments, a further dopant element (also referred to as "a third dopant element") may be implanted into a location of the region 210 of the conductive material by another implantation operation different from the implantation operations IMP1 and IMP2. The number of implantation operations may vary depending on detected results of the region 210 of the conductive material.

In some embodiments, the defects may be primarily repaired by filling the atoms and/or ions of the dopant material into the region 210 of the conductive material. In some embodiments, the seams or voids of the defects may be filled by the atoms and/or ions of the dopant material in the region 210 of the conductive material.

Figure 2E:
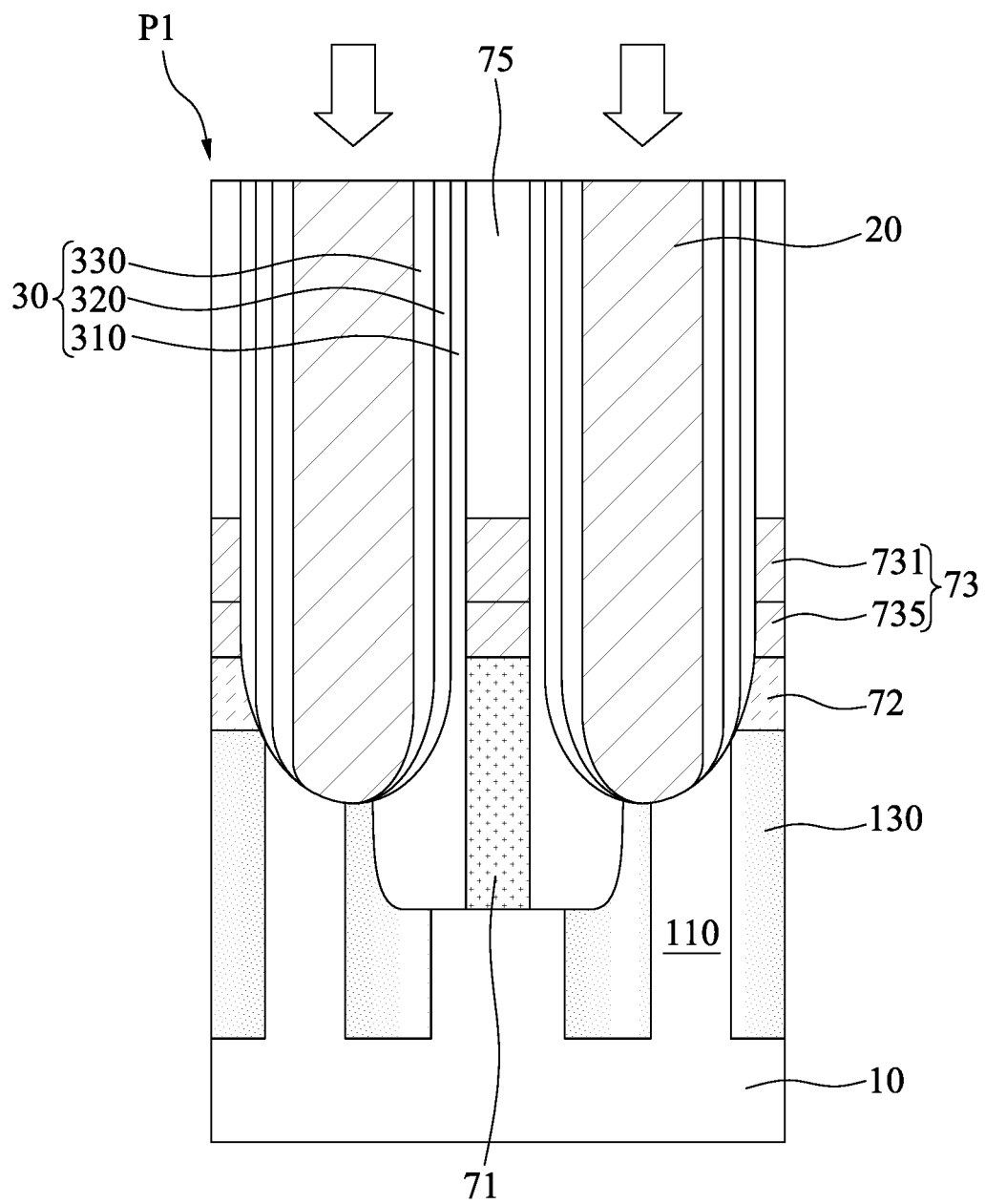
FIG. 2E illustrates one stage of a method of manufacturing a semiconductor structure, in accordance with some embodiments of the present disclosure.

Referring to FIG. 2E, which illustrates one stage of a method of manufacturing a semiconductor structure 1C, in accordance with some embodiments of the present disclosure, the conductive material in the trench 30T may be annealed.

In some embodiments, the conductive material in the trench 30T of the dielectric structure 30 is annealed to form an electrical contact 20. In some embodiments, the conductive material is annealed after the conductive material is implanted with one or more dopant elements. In some embodiments, the conductive material is annealed after the implantation operations are.

In some embodiments, the annealing temperature equals or exceeds about 900° C. In some embodiments, the annealing temperature is from about 900° C. to about 1100° C. In some embodiments, the annealing temperature is from about 900° C. to about 1000° C.

In some embodiments, after the annealing operation, the atoms and/or ions of the dopant material in the region 210 of the conductive material may be activated and chemically bond with adjacent atoms of the conductive material, and thus the defects of the conductive material can be repaired. Therefore, the resistance of the electrical contact 20 formed from the conductive material can be reduced, the data rate can be improved, and the current leakage can be further prevented.

In some embodiments, the atoms and/or ions having an atomic weight relatively close to that of the conductive element 200 of the conductive material, e.g., a difference in the atomic weights is less than about 100 or 50, and thus it may be easier for the atoms and/or ions to fill in the vacancies of the lattice defects of the conductive material. Therefore, the defects of the conductive material can be repaired more completely.

In some embodiments, the atoms and/or ions are filled in the seams or voids of the conductive material, and then the annealing operation can facilitate the grain stress relief. Therefore, the formation of seams or voids in the electrical contact 20 formed from the conductive material can be mitigated or prevented.

Figure 2F:
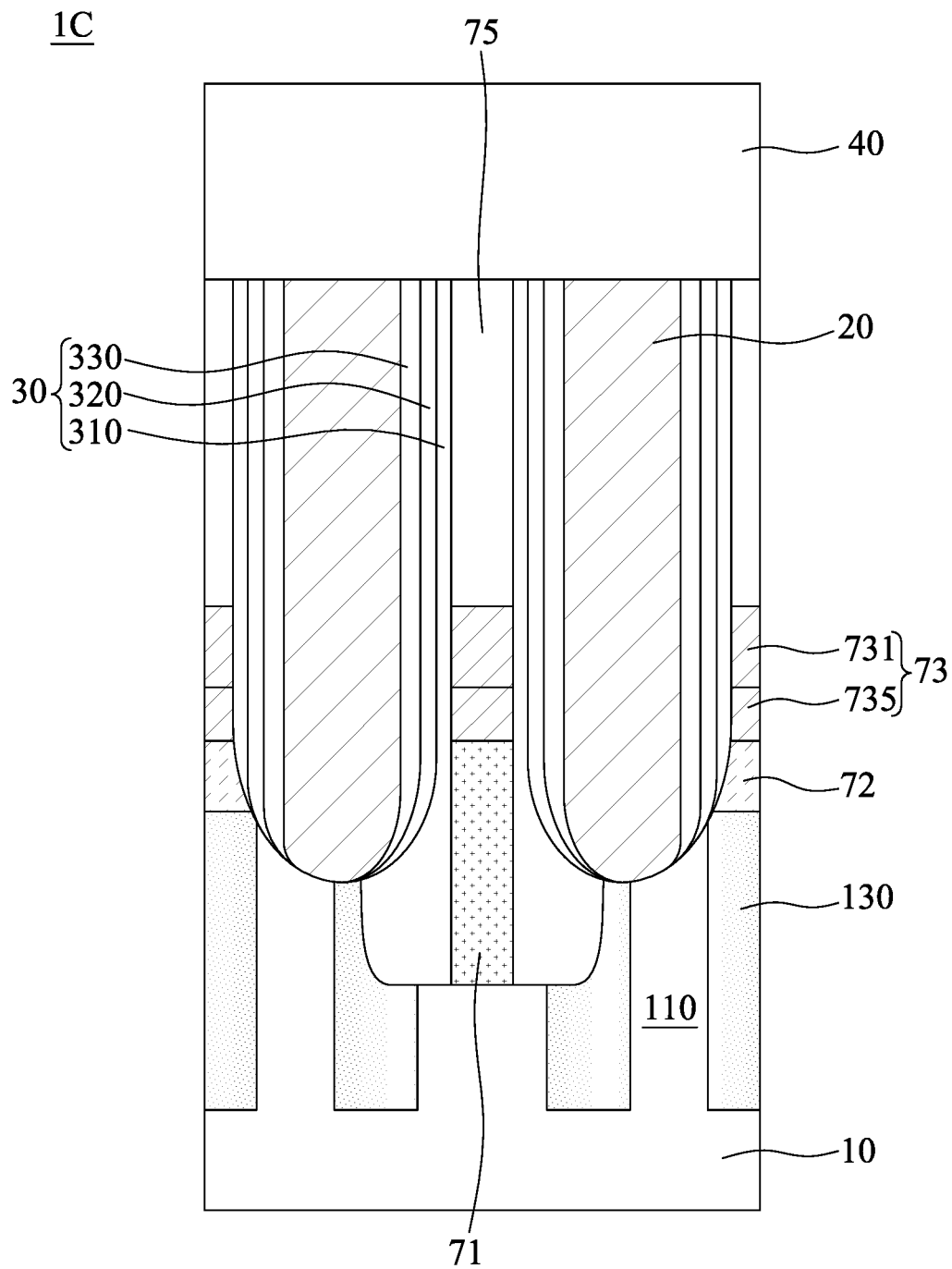
FIG. 2F illustrates one stage of a method of manufacturing a semiconductor structure, in accordance with some embodiments of the present disclosure.

Referring to FIG. 2F, which illustrates one stage of a method of manufacturing a semiconductor structure 1C, in accordance with some embodiments of the present disclosure, an electronic component 40 may be disposed over the electrical contact 20.

In some embodiments, the electronic component 40 is formed over the electrical contact 20. In some embodiments, the electronic component 40 is electrically connected to the electrical contact 20. In some embodiments, the electronic component 40 includes a capacitor. As such, the semiconductor structure 1C is formed.

When filling a conductive material in a trench to form an electrical contact, defects (e.g., lattice defects, seams, and/or voids) may be formed in the conductive material, especially in trenches having a relatively high aspect ratio. As such, an electrical contact formed from the conductive material having defects may experience increased resistance, current leakage may occur, and electrical performance affected.

In response thereto, according to some embodiments of the present disclosure, by implanting a dopant material into the region of the conductive material having one or more defects formed therein, the atoms and/or ions of the dopant material may repair the defects of the conductive material. Therefore, the resistance of an electrical contact formed from the repaired conductive material can be reduced, the data rate can be improved, and the current leakage can be further prevented.

FIG. 3A to FIG. 3E illustrate various stages of a method of manufacturing a semiconductor structure 1C, in accordance with some embodiments of the present disclosure.

Figure 3A:
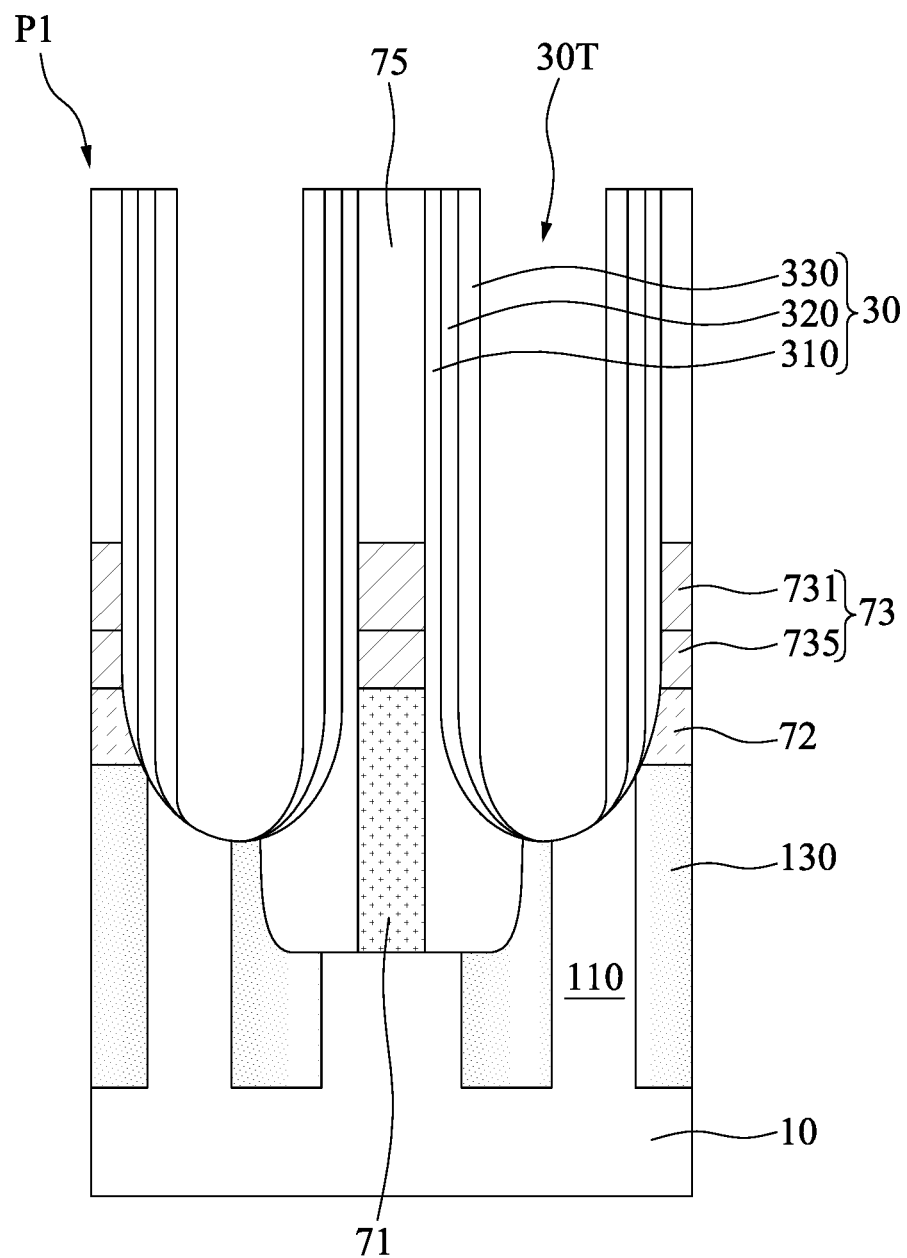
FIG. 3A illustrates one stage of a method of manufacturing a semiconductor structure, in accordance with some embodiments of the present disclosure.

Referring to FIG. 3A, which illustrates one stage of a method of manufacturing a semiconductor structure, in accordance with some embodiments of the present disclosure, a substrate 10 may be provided. The semiconductor substrate 10 may be formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other IV-IV, III-V or I-VI semiconductor material.

Still referring to FIG. 3A, an isolation structure 130 may be formed in the semiconductor substrate 10, and a plurality of active regions 110 of the semiconductor substrate 10 may be defined by the isolation structure 130. Photolithography may be performed to pattern the semiconductor substrate 10 to define positions of the plurality of active regions. Etching may be performed after the photolithography process to form a plurality of trenches in the semiconductor substrate 10. After etching, an insulating material such as silicon oxide, silicon nitride, silicon oxynitride, silicon nitride oxide, or fluoride-doped silicate, may be used to fill the plurality of trenches by deposition. Planarization, such as chemical mechanical polishing, may be performed after the deposition process to remove excess material and provide a substantially flat surface for subsequent processing steps and conformally form the isolation structure 130 and the plurality of active regions 110.

Still referring to FIG. 3A, a buffer layer 72 may be formed on the semiconductor substrate 10. The buffer layer 72 may be formed as a stacked layer or a single layer including silicon oxide, silicon nitride, silicon oxynitride, silicon nitride oxide, fluoride-doped silicate, or the like.

Still referring to FIG. 3A, one or more contact structures 71 may be formed in the buffer layer 72 and contacting the semiconductor substrate 10. One or more openings may be formed in the buffer layer 72 and extending into a portion of the semiconductor substrate 10. Photolithography may be performed to pattern the buffer layer 72 and a portion of the semiconductor substrate 10 to define the position of the opening. Etching may be performed after the photolithography process to form the opening in the buffer layer 72 and extending into the portion of the semiconductor substrate 10. The contact structure 71 may be correspondingly formed in the opening. In some embodiments, a conductive material, for example, doped polysilicon, a metal, or a metal silicide may be deposited into the opening by metallization. After metallization, planarization, such as chemical mechanical polishing, may be performed to remove excess material, provide a substantially flat surface for subsequent processing steps, and form the contact structure 71. The metal may be, for example, aluminum, copper, tungsten, cobalt, or an alloy thereof. The metal silicide may be, for example, nickel silicide, platinum silicide, titanium silicide, molybdenum silicide, cobalt silicide, tantalum silicide, tungsten silicide, or the like. In some embodiments, the contact structure 71 includes doped polysilicon. In some embodiments, the contact structure 71 may serve as a bit line contact.

Still referring to FIG. 3A, a conductive structure 73 may be formed on the semiconductor substrate 10. In some embodiments, a series of depositions may be performed to sequentially deposit a conductive layer 735 and a conductive layer 731 on the buffer layer 72 and the contact structure 71. The conductive layer 735 may be formed on the buffer layer 72 and the contact structure 71. The conductive layer 731 may be formed on the conductive layer 735. The conductive layer 735 may be formed of, for example, polysilicon or titanium nitride. The conductive layer 731 may be formed of, for example, copper, nickel, cobalt, aluminum, or tungsten. In some embodiments, the conductive structure 73 (e.g., the conductive layers 731 and 735) include bit line layers.

Still referring to FIG. 3A, an initial hardmask structure may be disposed on the conductive structure 73. A patterned photoresist layer may be formed over the initial hardmask structure and transferring a pattern to the hardmask structure 75. In some embodiments, the initial hardmask structure is etched to form the hardmask structure 75 having the pattern P1. In some embodiments, the initial hardmask structure is etched by plasma etching. In some embodiments, one or more etching operations may be further performed to remove portions of the active regions 110 and portions of the isolation structure 30 of the semiconductor substrate 10, portions of the contact structure 71, and portions of the conductive structure 73 to form one or more trenches defined by the hardmask structure 75.

Still referring to FIG. 2A, a dielectric structure 30 may be formed over the semiconductor substrate 10. In some embodiments, a series of deposition processes may be performed to sequentially deposit dielectric layers 310, 320 and 330 on the semiconductor substrate 10 and the inner walls of the trenches defined by the hardmask structure 75. In some embodiments, the dielectric layers 310, 320 and 330 are formed on the inner walls of the trenches defined by the hardmask structure to form the dielectric structure 30 having a trench 30T.

Figure 3B:
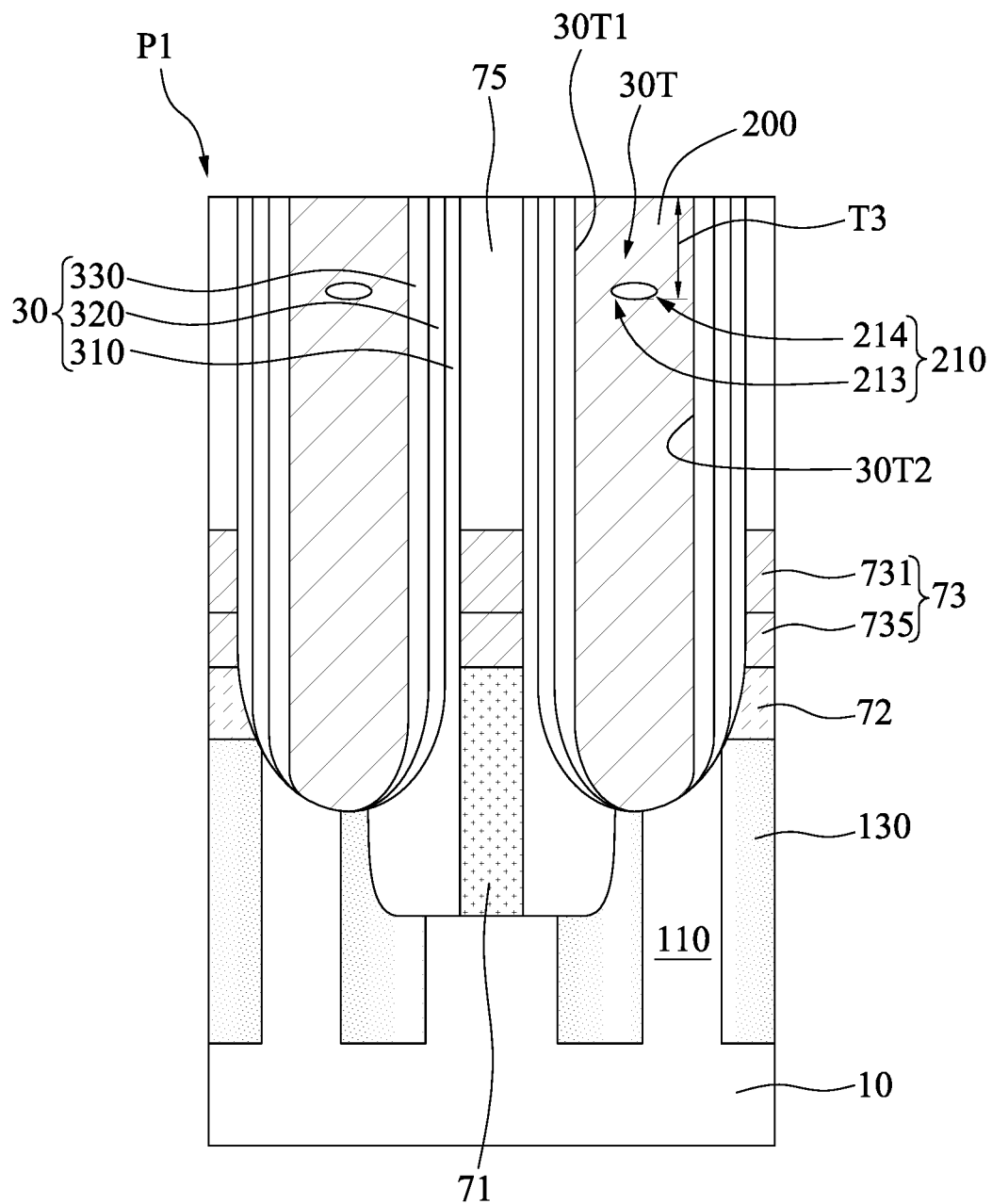
FIG. 3B illustrates one stage of a method of manufacturing a semiconductor structure, in accordance with some embodiments of the present disclosure.

Referring to FIG. 3B, which illustrates one stage of a method of manufacturing a semiconductor structure 1C, in accordance with some embodiments of the present disclosure, a conductive material may be filled in the trench 30T of the dielectric structure 30.

In some embodiments, one or more defects may be formed in a region 210 of the conductive material in the trench 30T. In some embodiments, a detection device may be used to identify defects. In some embodiments, a detection device may be used to determine the region 210 of the conductive material having one or more defects formed therein. In some embodiments, the defects may include seams, voids, or the like. In some embodiments, the following properties of the region 210 may be detected: a location (e.g., a depth) of the region 210, an area of the region 210, and/or a shape of the region 210. The detection device may include a scanning electron microscope (SEM), but the present disclosure is not limited thereto.

In some embodiments, the conductive material may be polysilicon or doped polysilicon. The seams and/or voids in the region 210 of the polysilicon or doped polysilicon material may be formed from lattice defects.

Figure 3C:
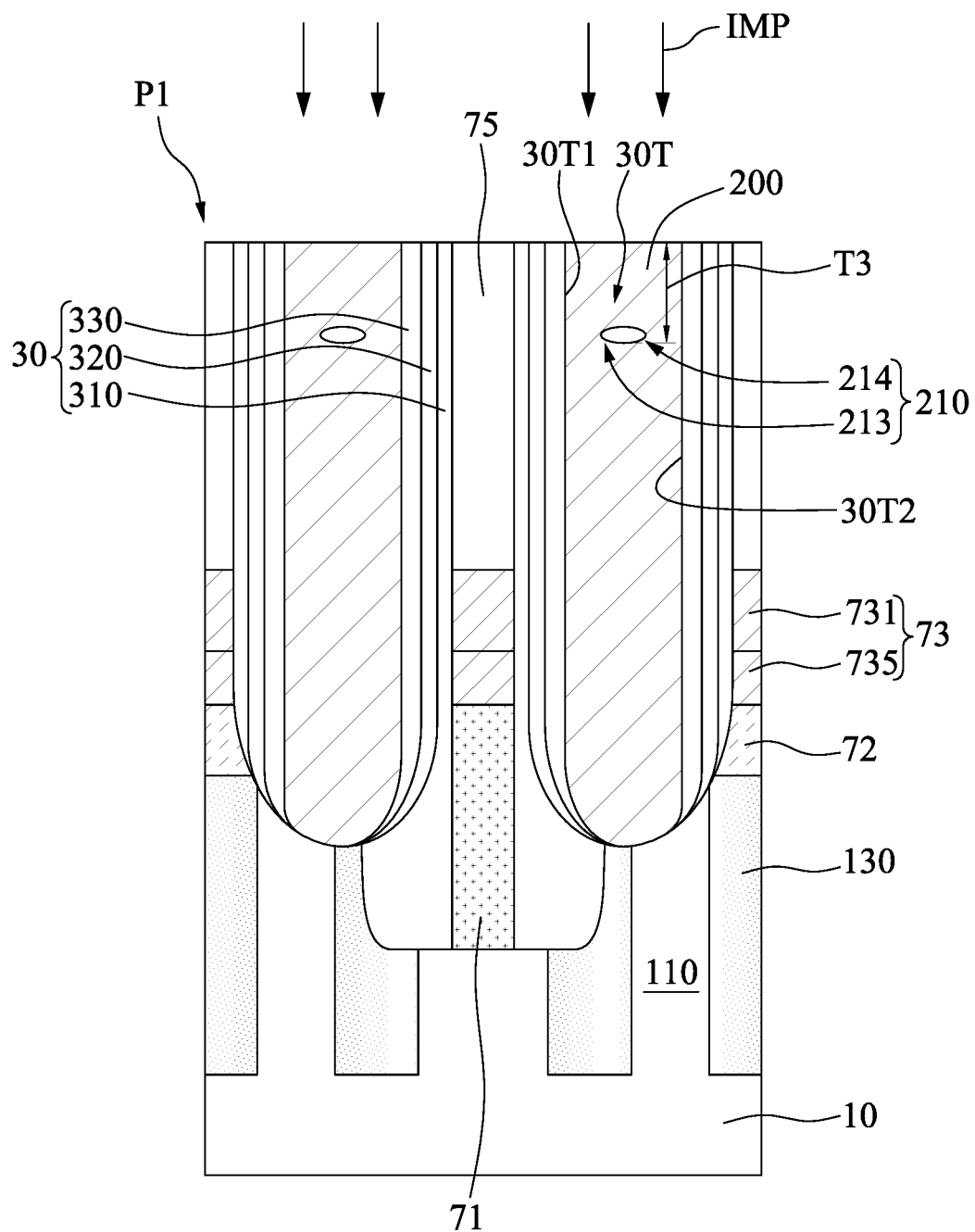
FIG. 3C illustrates one stage of a method of manufacturing a semiconductor structure, in accordance with some embodiments of the present disclosure.

Referring to FIG. 3C, which illustrates one stage of a method of manufacturing a semiconductor structure, in accordance with some embodiments of the present disclosure, the conductive material in the trench 30T may be implanted.

In some embodiments, a dopant material is implanted into the region 210 of the conductive material. In some embodiments, one or more processing parameters used for implanting the conductive material are determined according to the detected results of the region 210 of the conductive material. In some embodiments, the one or more processing parameters can include dopant concentration (or implant dosage concentration), implant dosage energy, implantation temperature, and implantation incidence angle. In some embodiments, one or more processing parameters used for implanting the conductive material are determined according to the location (e.g., the depth), the area, and/or the shape of the region 210 of the conductive material.

In some embodiments, the dopant material has a dopant concentration equaling or exceeding about $10^{15}$ atom/cm³. In some embodiments, the dopant concentration of the dopant material is from about $10^{15}$ atom/cm³ to about $10^{19}$ atom/cm³. In some embodiments, the dopant concentration of the dopant material is from about $10^{15}$ atom/cm³ to about $10^{18}$ atom/cm³. In some embodiments, the dopant concentration of the dopant material is from about $10^{15}$ atom/cm³ to about $10^{17}$ atom/cm³.

In some embodiments, the implant dosage energy is from about 10 keV to about 50 keV. In some embodiments, the implant dosage energy is from about 20 keV to about 45 keV. In some embodiments, the implant dosage energy is from about 30 keV to about 40 keV. Relatively small implant dosage energy may reduce penetration depth of the dopants, and relatively high implant dosage energy may increase penetration depth.

In some embodiments, the implantation temperature is from about 400° C. to about 700° C. In some embodiments, the implantation temperature is from about 450° C. to about 650° C. In some embodiments, the implantation temperature is from about 500° C. to about 600° C.

In some embodiments, the implantation incidence angle is from about 45° to about 90°. In some embodiments, the implantation incidence angle is from about 50° to about 85°. In some embodiments, the implantation incidence angle is from about 60° to about 80°. The penetrating depth of the dopant material may be adjusted by varying the implantation incidence angle. Reduced implantation incidence angle provides less penetration depth.

In some embodiments, the conductive material includes a conductive element 200, the dopant material includes a dopant element, and a difference between an atomic weight of the conductive element 200 and an atomic weight of a dopant element of the dopant material is less than about 100. In some embodiments, the difference between the atomic weight of the conductive element 200 and the atomic weight of the dopant element of the dopant material is less than about 50. In some embodiments, the dopant material includes Si, Ge, P, As, Sb, or any combination thereof.

In some embodiments, the conductive material includes polysilicon, and the dopant material includes one or more dopant elements having an atomic weight from about 28 to about 130. In some embodiments, the dopant material includes Si, Ge, P, As, Sb, or any combination thereof.

In some embodiments, the region 210 of the conductive material having one or more defects formed therein may include a plurality of different locations (e.g., locations 213 and 214). In some embodiments, the various locations of the region 210 have substantially the same depth T3. In some embodiments, the location 213 of the region 210 is adjacent to a sidewall 30T1 of the trench 30T, and the location 214 of the region 210 is adjacent to a sidewall 30T2 of the trench 30T.

In some embodiments, one or more dopant elements may be implanted into the location 213 and the location 214 of the region 210 of the conductive material by one or more implantation operations IMP. In some embodiments, the implantation incidence angles of the multiple implantation operations IMP may be different depending on the locations 213 and 214. In some embodiments, the number of implantation operations may vary depending on detected results of the region 210 of the conductive material.

In some embodiments, the dopant elements for the multiple implantation operations IMP may be the same or different from each other, and the dopant elements for the multiple implantation operations IMP each may include Si, Ge, P, As, or Sb.

Figure 3D:
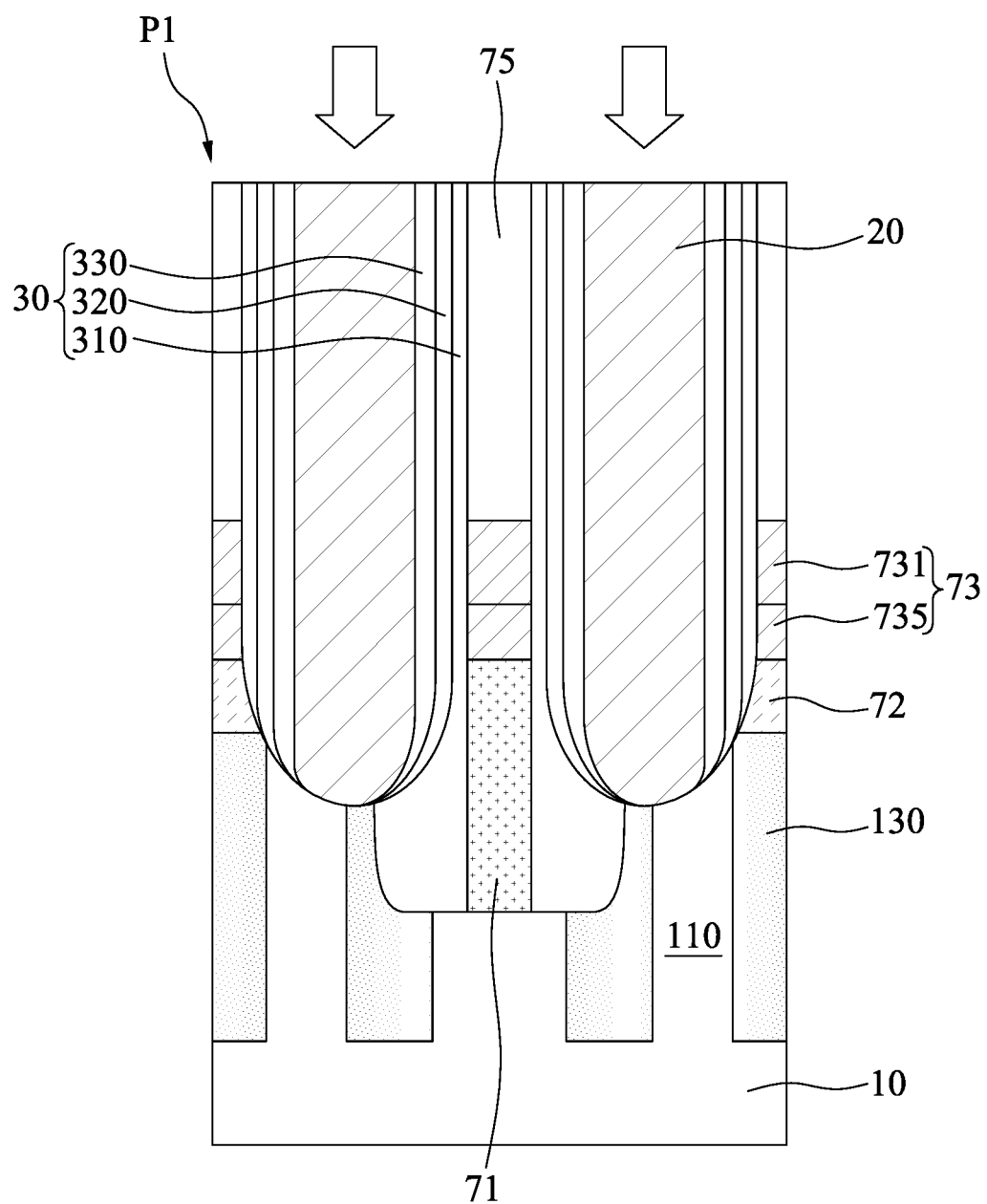
FIG. 3D illustrates one stage of a method of manufacturing a semiconductor structure, in accordance with some embodiments of the present disclosure.

Referring to FIG. 3D, which illustrates one stage of a method of manufacturing a semiconductor structure 1C, in accordance with some embodiments of the present disclosure, the conductive material in the trench 30T may be annealed.

In some embodiments, the conductive material in the trench 30T of the dielectric structure 30 is annealed to form an electrical contact 20. In some embodiments, the conductive material is annealed after the conductive material is implanted with one or more dopant elements. In some embodiments, the conductive material is annealed after the implantation operations.

In some embodiments, the annealing temperature equals or exceeds about 900° C. In some embodiments, the annealing temperature is from about 900° C. to about 1100° C. In some embodiments, the annealing temperature is from about 900° C. to about 1000° C.

Figure 3E:
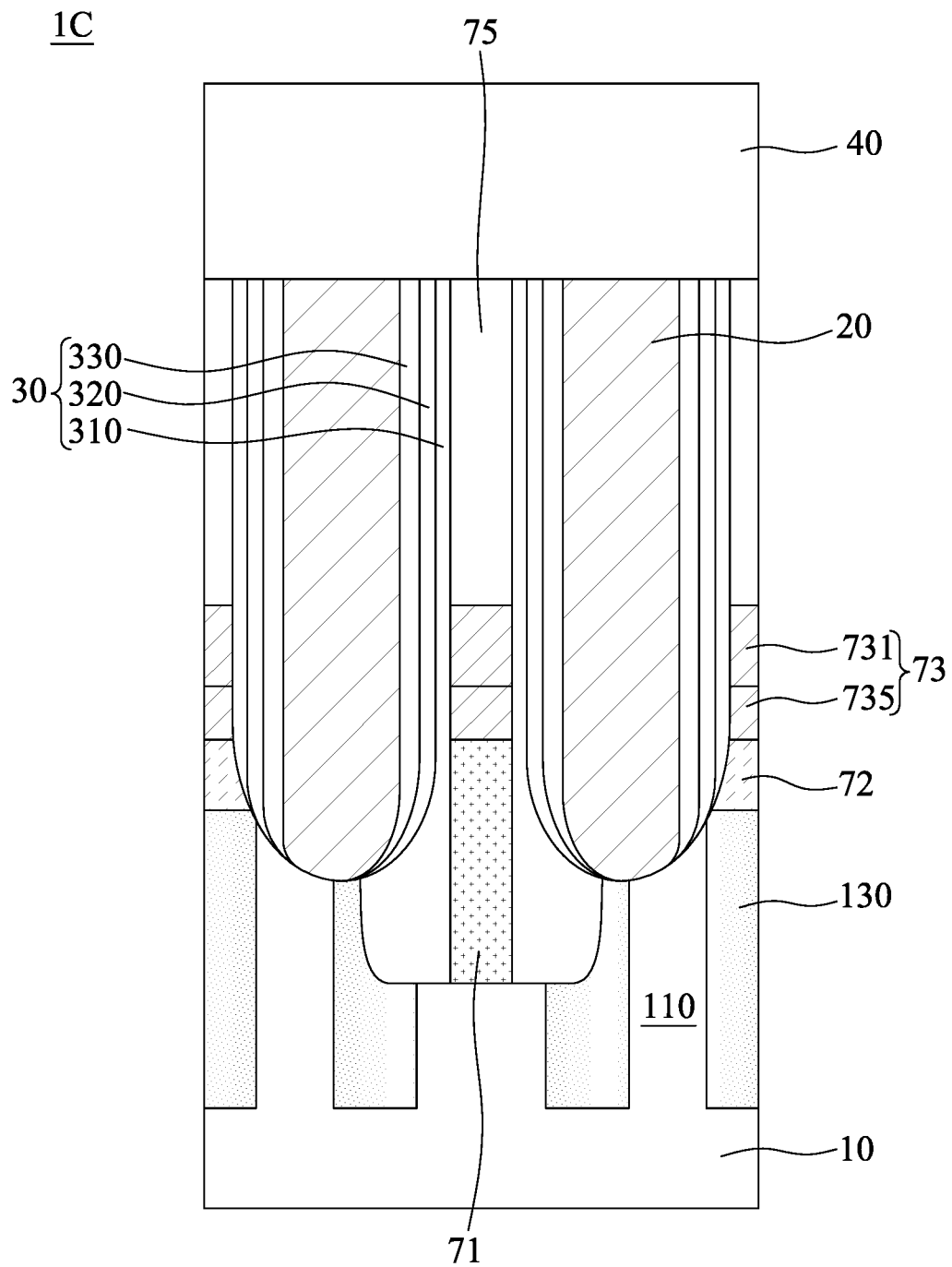
FIG. 3E illustrates one stage of a method of manufacturing a semiconductor structure, in accordance with some embodiments of the present disclosure.

Referring to FIG. 3E, which illustrates one stage of a method of manufacturing a semiconductor structure 1C, in accordance with some embodiments of the present disclosure, an electronic component 50 may be disposed over the electrical contact 20.

In some embodiments, the electronic component 40 is formed over the electrical contact 20. In some embodiments, the electronic component 40 is electrically connected to the electrical contact 20. In some embodiments, the electronic component 40 includes a capacitor. As such, the semiconductor structure 1C is formed.

Figure 4A:
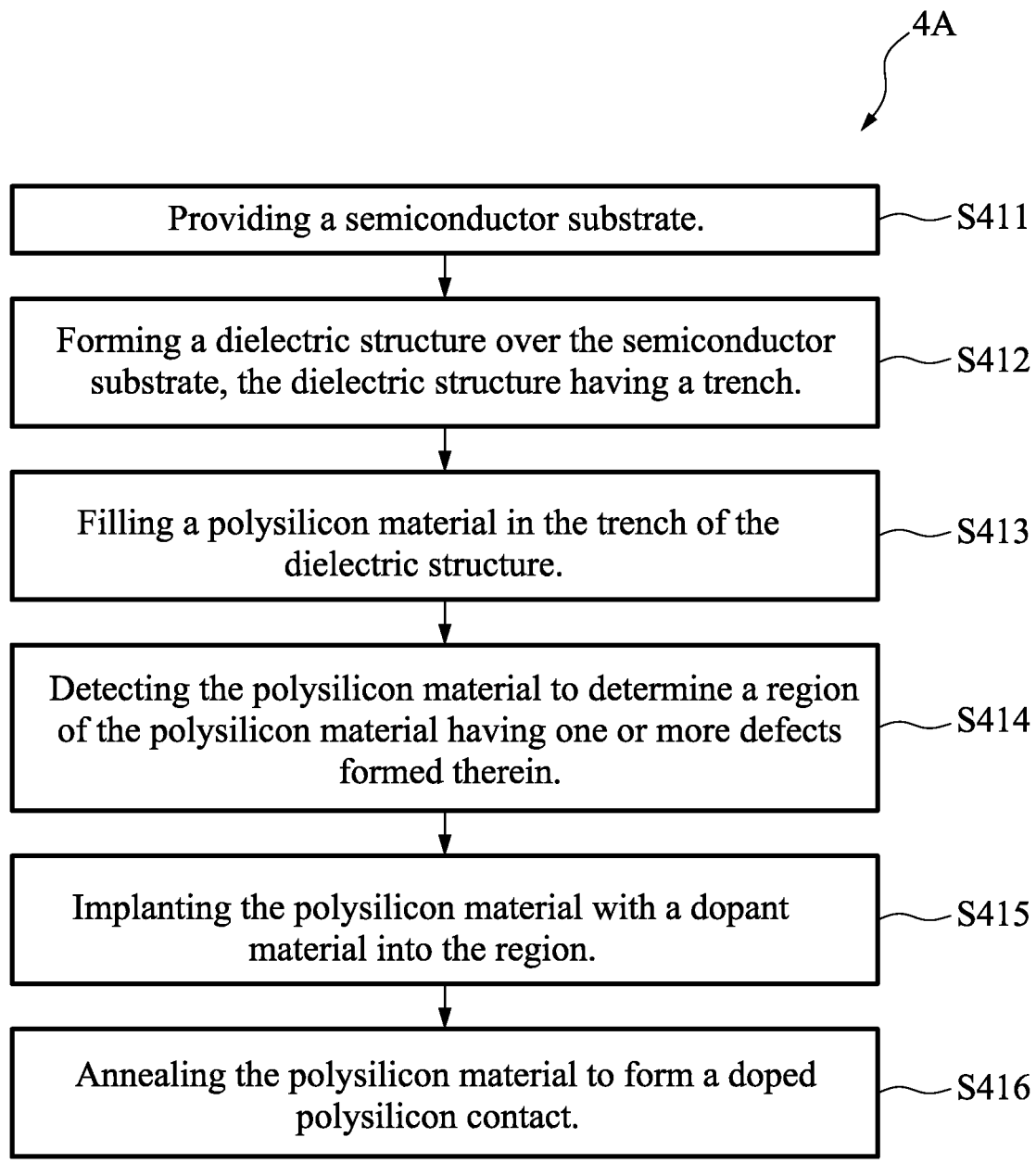
FIG. 4A is a flowchart of a method of manufacturing a semiconductor structure, in accordance with some embodiments of the present disclosure.

FIG. 4A is a flowchart of a method 4A of manufacturing a semiconductor structure, in accordance with some embodiments of the present disclosure.

The method 4A begins with operation S411 in which a semiconductor substrate is provided.

The method 4A continues with operation S412 in which a dielectric structure is over the semiconductor substrate. The dielectric structure has a trench.

The method 4A continues with operation S413 in which a polysilicon material is filled in the trench of the dielectric structure.

The method 4A continues with operation S414 in which the polysilicon material is detected to determine a region of the polysilicon material having one or more defects formed therein.

The method 4A continues with operation S415 in which the polysilicon material is implanted with a dopant material into the region.

The method 4A continues with operation S416 in which the polysilicon material is annealed to form a doped polysilicon contact.

The method 4A is merely an example, and is not intended to limit the present disclosure beyond what is explicitly recited in the claims. Additional operations can be provided before, during, or after each operations of the method 4A, and some operations described can be replaced, eliminated, or moved around for additional embodiments of the method. In some embodiments, the method 4A can include further operations not depicted in FIG. 4A. In some embodiments, the method 4A can include one or more operations depicted in FIG. 4A.

Figure 4B:
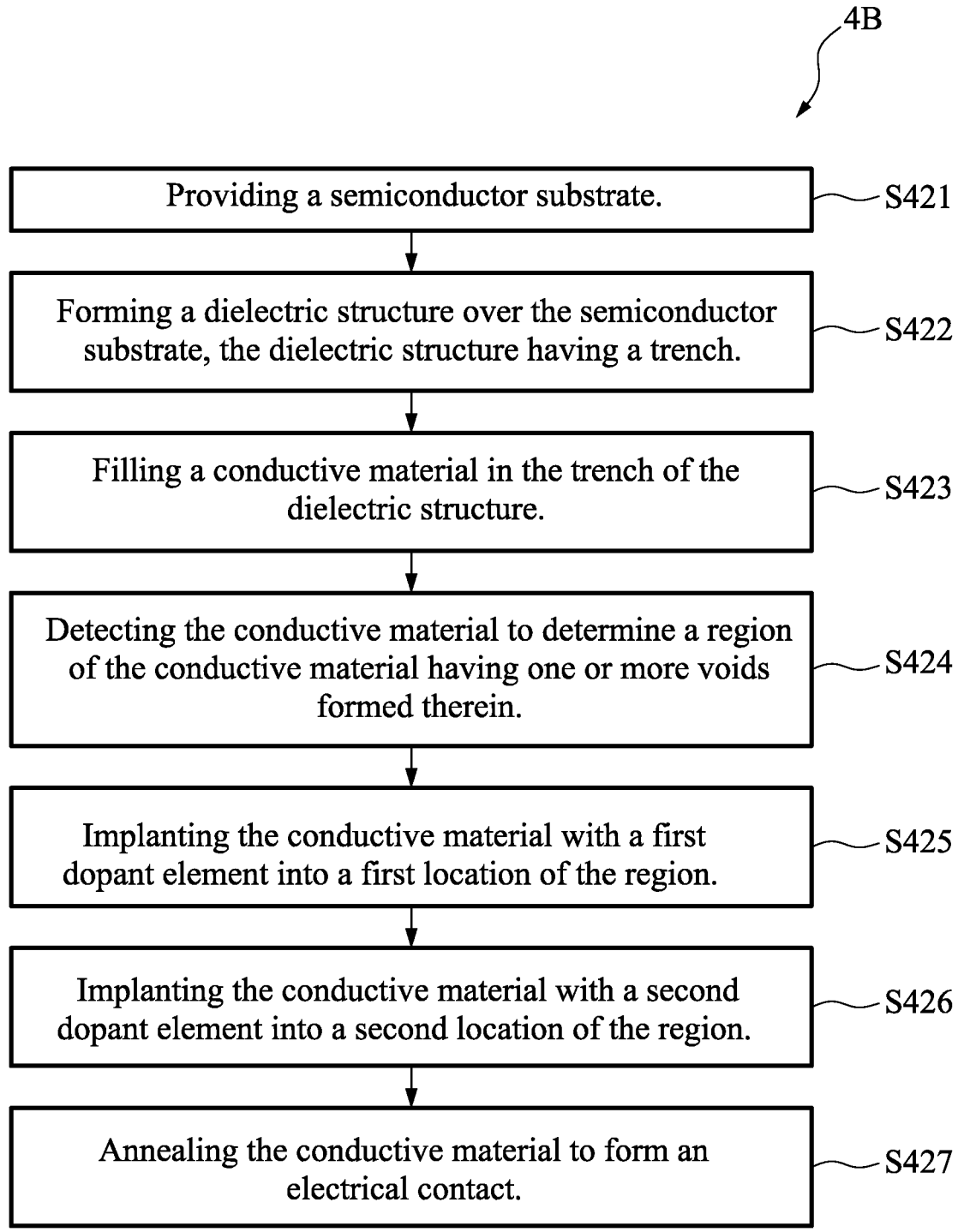
FIG. 4B is a flowchart of a method of manufacturing a semiconductor structure, in accordance with some embodiments of the present disclosure.

FIG. 4B is a flowchart of a method 4B of manufacturing a semiconductor structure, in accordance with some embodiments of the present disclosure.

The method 4B begins with operation S421 in which a semiconductor substrate is provided.

The method 4B continues with operation S422 in which a dielectric structure is over the semiconductor substrate. The dielectric structure has a trench.

The method 4B continues with operation S423 in which a conductive material is filled in the trench of the dielectric structure.

The method 4B continues with operation S424 in which the conductive material is detected to determine a region of the conductive material having one or more voids formed therein.

The method 4B continues with operation S425 in which the conductive material is implanted with a first dopant element into a first location of the region.

The method 4B continues with operation S426 in which the conductive material is implanted with a second dopant element into a second location of the region.

The method 4B continues with operation S427 in which the conductive material is annealed to form an electrical contact.

The method 4B is merely an example, and is not intended to limit the present disclosure beyond what is explicitly recited in the claims. Additional operations can be provided before, during, or after each operations of the method 4B, and some operations described can be replaced, eliminated, or moved around for additional embodiments of the method. In some embodiments, the method 4B can include further operations not depicted in FIG. 4B. In some embodiments, the method 4B can include one or more operations depicted in FIG. 4B.

One aspect of the present disclosure provides a semiconductor structure including a semiconductor substrate and a doped polysilicon contact. The doped polysilicon contact is disposed over the semiconductor substrate. The doped polysilicon contact includes a dopant material having a dopant concentration equaling or exceeding about $10^{15}$ atom/cm$^3$.

Another aspect of the present disclosure provides a semiconductor structure including a semiconductor substrate and an electrical contact. The electrical contact is electrically connected to the semiconductor substrate. The electrical contact includes a conductive element and a dopant material having a dopant concentration equaling or exceeding about $10^{15}$ atom/cm$^3$. The dopant material includes a first dopant element, and a difference between an atomic weight of the conductive element and an atomic weight of the first dopant element is less than about 100.

Another aspect of the present disclosure provides a method of manufacturing a semiconductor structure. The method includes providing a semiconductor substrate and forming a dielectric structure over the semiconductor substrate, the dielectric structure having a trench. The method also includes filling a polysilicon material in the trench of the dielectric structure and detecting the polysilicon material to determine a region of the polysilicon material having one or more defects formed therein. The method further includes implanting the polysilicon material with a dopant material into the region and annealing the polysilicon material to form a doped polysilicon contact.

By implanting a dopant material into a region of a conductive material having one or more defects formed in a trench, the atoms and/or ions of the dopant material may repair the defects of the conductive material. Therefore, the resistance of an electrical contact formed from the repaired conductive material can be reduced, the data rate can be improved, and the current leakage can be further prevented.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor structure, comprising:
   providing a semiconductor substrate;
   upwardly extending a dielectric structure from the semiconductor substrate, the dielectric structure having a trench;
   filling a polysilicon material in the trench of the dielectric structure;
   inspecting the polysilicon material to determine a region of the polysilicon material having one or more defects formed therein, which comprises:
   scanning the polysilicon material to determine a first location of the defect in the region of the polysilicon material having a first depth being measured with respect to a top surface of the dielectric structure; and
   scanning the polysilicon material to determine a second location of the defect in the region of the polysilicon material having a second depth being measured with respect to the top surface of the dielectric structure, wherein the first depth is less than the second depth;

implanting a first dopant element at the first location of the defect in the region via a first implantation operation; and after implanting the first dopant element at the first location of the defect, implanting a second dopant element at the second location of the defect in the region via a second implantation operation to place the second dopant element below the first dopant element, wherein the first dopant element is different from the second dopant element, such that the first dopant element and the second dopant element are filled at the first depth and the second depth of the defect via the first implantation operation and the second implantation operation respectively; and annealing the polysilicon material to form a doped polysilicon contact.

2. The method of claim 1, further comprising obtaining one or more processing parameters used for implanting the polysilicon material according to the detected region of the polysilicon material, wherein the polysilicon material is inspected by a scanning electron detection microscope (SEM) to determine the first location and the second location of the defect at the region of the polysilicon material.

3. The method of claim 2, wherein the processing parameters are a dopant concentration, an implant dosage energy, an implantation temperature, and an implantation incidence angle, the dopant concentration of each of the first dopant material and the second dopant material equaling or exceeding about $10^{15}$ atom/cm$^3$.

4. The method of claim 1, wherein an implantation incidence angle of the first implantation operation is smaller than an implantation incidence angle of the second implantation operation.

5. The method of claim 1, wherein wherein an atomic weight of the first dopant element is greater than an atomic weight of the second dopant element.

6. The method of claim 5, wherein at least one of processing parameters used in the first implantation operation is different from at least one of processing parameters used in the second implantation operation, wherein the processing parameters are dopant concentrations, implant dosage energies, implantation temperatures, and the implantation incidence angles used in the implantaions operations.

7. The method of claim 1, wherein each of the first dopant material and the second dopant material is selected from a group consisting of Si, Ge, P, As, and Sb.

8. The method of claim 1, further comprising disposing an electronic component over and electrically connected to the doped polysilicon contact.

* * * * *